(12) United States Patent
Ahn et al.

(10) Patent No.: US 6,465,302 B1
(45) Date of Patent: Oct. 15, 2002

(54) METHOD OF MANUFACTURING A FLASH MEMORY DEVICE

(75) Inventors: Byung Jin Ahn, Seoul; Hee Hyun Chang; Ju Yeab Lee, both of Kyungki-Do, all of (KR)

(73) Assignee: Hyundai Electronic Industries Co., Ltd., Ichon-shi (KR)

( * ) Notice: Subject to any disclaimer, the term of this patent is extended or adjusted under 35 U.S.C. 154(b) by 129 days.

(21) Appl. No.: 09/722,030

(22) Filed: Nov. 27, 2000

(30) Foreign Application Priority Data

Dec. 29, 1999 (KR) .......................................... 99-65054

(51) Int. Cl.⁷ ...................... H01L 21/336; H01L 29/788
(52) U.S. Cl. ........................ 438/257; 438/264; 257/315
(58) Field of Search ................................ 438/264–267, 438/257; 257/303–332

(56) References Cited

U.S. PATENT DOCUMENTS 5,841,163 A * 11/1998 Joo et al. ..................... 257/316
6,258,669 B1 * 7/2001 Park ............................ 438/264

FOREIGN PATENT DOCUMENTS

JP          11-026730         1/1999

* cited by examiner

*Primary Examiner*—Caridad Everhart
*Assistant Examiner*—Calvin Lee
(74) *Attorney, Agent, or Firm*—Finnegan, Henderson, Farabow, Garrett & Dunner, L.L.P.

(57) ABSTRACT

There is disclosed a method of manufacturing a flash memory device. In order to solve the problems that expensive photograph equipments are required and the manufacturing costs are thus increased when defining a floating gate and a control gate in a flash memory cell used in a high-integration flash memory device, the present invention performs an etching process for defining a floating gate with an-isotropic etching process. Therefore, it can minimize the areas of a cell and thus obtain a high-integration device.

2 Claims, 3 Drawing Sheets

METHOD OF MANUFACTURING A FLASH MEMORY DEVICE

CROSS-REFERENCE TO RELATED APPLICATION

Priority is claimed from Republic of Korean Patent Application No. 99-65054 filed Dec. 29, 1999, which is incorporated in its entirety by reference.

BACKGROUND OF THE INVENTION

1. Field of the Invention

The invention relates generally to a method of manufacturing a flash memory device. More particularly, the present invention relates to a method of manufacturing a flash memory device capable of minimizing the area of a cell.

2. Description of the Prior Art

A flash memory device is a semiconductor device which find applications in potable electronic products such as PDAs, cellular phones, etc., computer BIOS, a printer, etc. This flash memory device is an electrically erasable and programmable device, which performs program/erase functions by which electrons are moved by a strong electric field with a thin tunnel oxide film of about 100 Å, thus changing the threshold voltage of the cell. Then, the conventional flash memory device will be below explained by reference to FIG. 1.

FIGS. 1A and 1B are a cross-sectional view and an equivalent circuit diagram of a conventional flash memory cell.

As shown in FIG. 1A, the conventional flash memory device has a structure in which a floating gate 12 electrically isolated from a semiconductor device by a tunnel oxide, and a control gate 13 electrically isolated from the floating gate 12 by a dielectric film used to give a high dielectric constant are stacked. Also, a source S region and a drain D region are formed on the semiconductor substrate 11 underlying both sides of the cell. At this time, the tunnel oxide film is formed in thickness of 100 Å and the control gate 13 acts as a word line of the cell.

Upon a program operation of the flash memory cell having the above mentioned structure, the source S and the semiconductor substrate 11 are grounded ($V_S=V_B=V_{SS}$) and a voltage of 9.0V ($V_{CG}$=9V) is applied to the control gate 13, while a voltage of 5V ($V_D$=5V) is applied to the drain D and the control gate voltage and the drain voltage is applied with a pulse of 5 µs. If a voltage is applied under this condition, channel hot electron ("CHE") crosses over the potential barrier of the oxide film to be stored at the floating gate 12, thus completing the program operation. Upon an erase operation, if a negative voltage of −9V ($V_{CG}$=−9V) is applied to the control gate 13 and a high voltage of 9V ($V_D$=−9V) is applied to the semiconductor substrate 11, electrons stored at the floating gate are flowed out by Fowler-Nordheim tunneling, thus completing the erase operation.

FIG. 1B shows a structure in which the flash memory cell having the above mentioned structure is constructed in a NOR-type cell array.

As shown, the control gates of each of the cells are used as word lines W/L(n−1), W/L(n), W/L(n+1) and the drains of each of the cells are used as bit lines B/L(n), B/L(n+1).

In case that this type of NOR-type cell array is constructed, the floating gate storing the charges and the control gate used as the word lines of the cell are formed by mask process. As the channel length and area of the cell is determined by the definition capability of the photography equipments, there is a problem that expensive photography equipments, etc. are required to implement a high-integrated cell in the future. Therefore, in order to manufacture a new flash memory cell, additional advanced technologies are required. Thus, due to additional investment of equipments, there are problems that the manufacturing cost is increased and reduction in investment cost is difficult.

SUMMARY OF THE INVENTION

It is therefore an object of the present invention to provide a method of manufacturing a flash memory device that can minimize the areas of a cell and obtain a high-integrated device, by proceeding etching process defining a floating gate with an-isotropic etching process.

In order to accomplish the above object, a method of manufacturing a flash memory device according to the present invention is characterized in that it comprises the steps of, after sequentially forming a pad oxide film and a pad nitride film on a semiconductor substrate, removing a portion of the pad nitride film in which a source formation region will be formed, and then implementing a source ion implantation process; performing a thermal oxidization process to form a device separation film at the portion in which the pad nitride film is removed; removing the pad nitride film and the oxidization film left on the semiconductor substrate and then implementing an ion implantation process for adjusting the threshold voltage; forming a tunnel oxide film and a first polysilicon layer on the semiconductor substrate; etching the first polysilicon layer by an-isotropic etching process to leave first polysilicon only on the sidewalls of the device separation film in the step portion for which the device separation film and the semiconductor substrate make, thus defining a floating gate; and after performing a drain ion implantation process, sequentially forming a dielectric film and a second polysilicon layer for control gate on the entire structure.

BRIEF DESCRIPTION OF THE DRAWINGS

The aforementioned aspects and other features of the present invention will be explained in the following description, wherein.

DETAILED DESCRIPTION OF PREFERRED EMBODIMENTS

The present invention will be described in detail by way of a preferred embodiment with reference to accompanying drawings.

FIGS. 2A to 2G are cross-sectional views of a device for explaining a method of manufacturing a flash memory device according to the present invention.

Figure 1A:
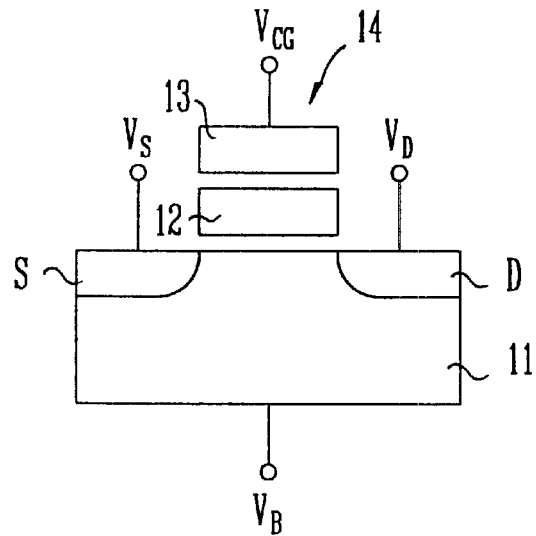
FIG. 1A and 1B are a cross-sectional view and an equivalent circuit diagram of a conventional flash memory cell.
Figure 1B:
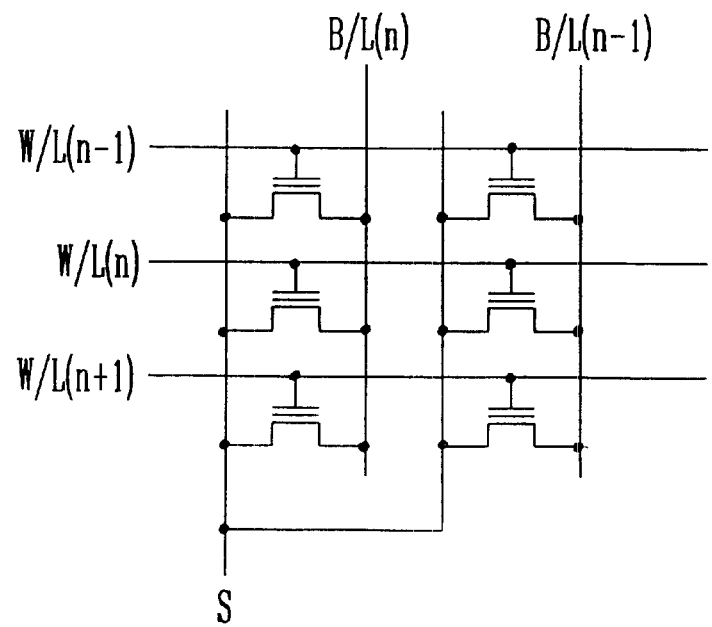
Figure 2A:
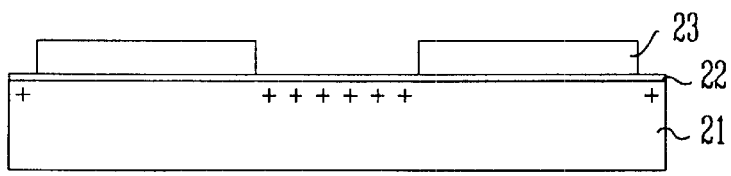
FIGS. 2A to 2G are cross-sectional views of a device for explaining a method of manufacturing a flash memory device according to the present invention.

First, a pad oxide film 22 and a pad nitride film 23 are sequentially formed on a semiconductor substrate 21, as shown in FIG. 2A. Then, after a source formation region of a cell is defined by ISO mask process, the pad nitride film 23 in the source formation region is removed. Next, a source ion is implanted into the semiconductor substrate 21 in which the pad nitride film 23 is removed. At this time, the pad oxide film 22 is formed in thickness of 100 Å, and the pad nitride film 23 is formed in thickness of 100 Å. Also, the source ion implantation process is implemented using a N-type ion in case that a N-channel flash memory cell is to be manufactured while implemented using a P-type ion in case that a P-channel flash memory cell is to be manufactured.

Figure 2B:
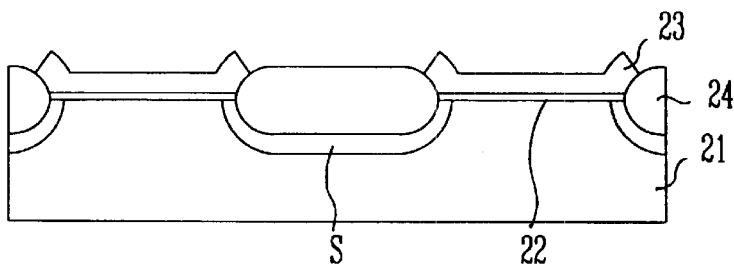

Then, a device separation film 24 is formed in thickness of about 3000 Å by thermal oxidization process, as shown in FIG. 2B. During the thermal oxidization process, ions implanted into the semiconductor substrate 21 are diffused to form a source S region.

Figure 2C:
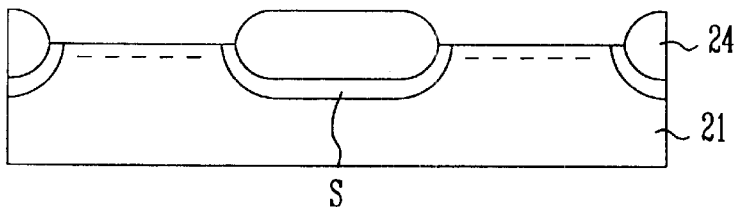

Next, after the pad nitride film 23 and the pad oxide film 22 on the semiconductor substrate 21 are removed, as shown in FIG. 2C, an ion implantation process for adjusting the threshold voltage is performed in order to secure the characteristic of the cell. The ion implantation process for adjusting the threshold voltage is implemented using a P-type ion in case that a N-channel flash memory cell is to be manufactured while implemented using a N-type ion in case that a P-channel flash memory cell is to be manufactured.

Figure 2D:
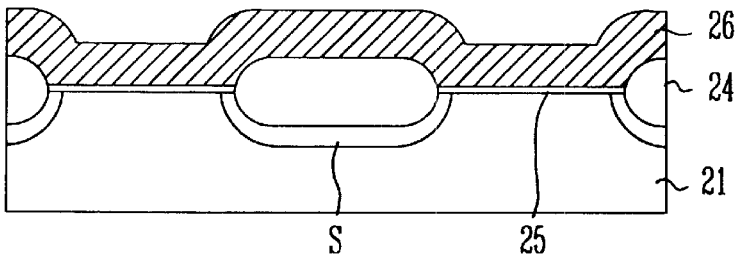

Thereafter, after a tunnel oxide film 25 is formed in thickness of 100 Å on the exposed semiconductor substrate 21, as shown in FIG. 2D, a first polysilicon layer 26 for floating gate is formed on the entire structure.

Figure 2E:
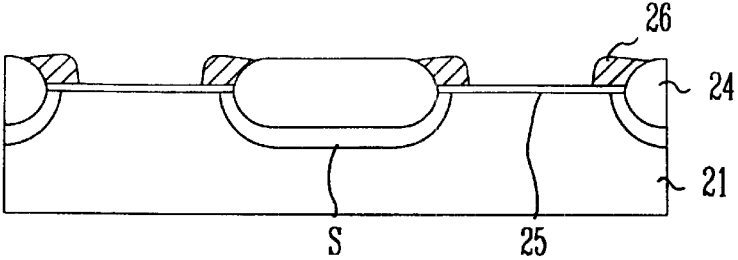

Then, as shown in FIG. 2E, the first polysilicon layer 26 is etched by an-isotropic etching process, thus remaining first polysilicon only on the sidewalls of the device separation film 24 in the step portion for which the device separation film 24 and the semiconductor substrate 21 are making. Due to this, the floating gate is defined.

Figure 2F:
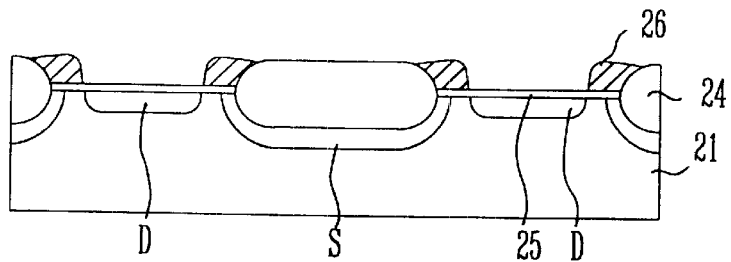

Next, as shown in FIG. 2F, a drain D region is formed by drain ion implantation process and thermal process. At this time, the drain ion implantation process is implemented using a N-type ion in case that a N-channel flash memory cell is to be manufactured while implemented using a P-type ion in case that a P-channel flash memory cell is to be manufactured.

Figure 2G:
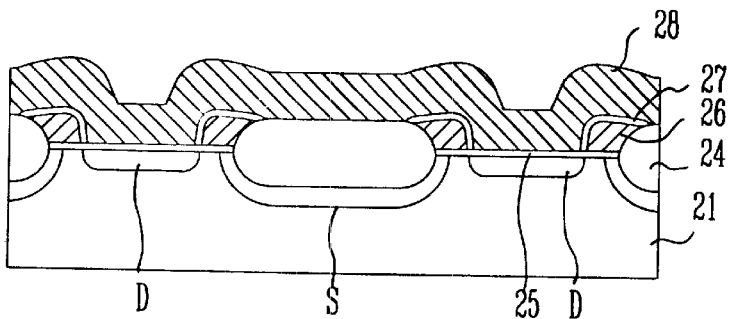

As shown in FIG. 2G, after a dielectric film 27 and a second polysilicon layer for control gate 28 are formed, common subsequent processes are performed to complete the process of manufacturing a flash memory device.

Figure 3:
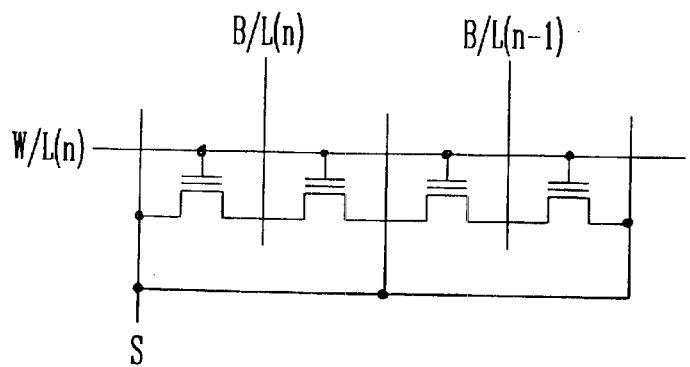
FIG. 3 is an equivalent circuit diagram of a flash memory device according to the present invention.

FIG. 3 is an equivalent circuit diagram of a flash memory device according to the present invention, in which a plurality of cells are connected between a word line W/L(n) and bit lines B/L(n), B/L(n+1). From this, it can be seen that neighboring two cells share the bit line and two pairs of cells sharing the bit lines share the source region.

As mentioned above, the present invention can minimize the areas of a cell and thus increase the integration level of a device, by use of an-isotropic etching process when defining a floating gate in a flash memory cell. Also, the present invention can reduce the manufacturing cost since it can minimize the cell area without additional equipment investment.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A method of manufacturing a flash memory device, comprising:

forming sequentially a pad oxide film and a pad nitride film on a semiconductor substrate;

forming a source, said forming comprising removing a portion of said pad nitride film to form a source formation region and implanting source ions in said source formation region;

performing a thermal oxidization process to form a device separation film at said source formation region;

removing said pad nitride film and said oxidization film remaining on said semiconductor substrate and subsequently implanting ions to adjusting a threshold voltage;

forming a tunnel oxide film and a first polysilicon layer on said semiconductor substrate;

defining a floating gate, said defining comprising etching said first polysilicon layer, said etching comprising an-isotropic etching process that leaves said first polysilicon layer only on sidewalls of said device separation film in a step portion, said step portion comprising said device separation film and said semiconductor substrate; and implanting drain ions and sequentially forming a dielectric film and a second polysilicon layer for a control gate on the entire structure.

2. The method according to claim 1, wherein said device separation film has a thickness of about 3000 Å.

* * * * *